United States Patent
Tsai

(10) Patent No.: US 9,968,014 B2
(45) Date of Patent: May 8, 2018

(54) SHIELDING COVER, SHIELDING COVER ASSEMBLY AND ELECTRONIC DEVICE EMPLOYING THE SAME

(71) Applicant: Chiun Mai Communication Systems, Inc., New Taipei (TW)

(72) Inventor: Mong-Hau Tsai, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days. days.

(21) Appl. No.: 15/343,422

(22) Filed: Nov. 4, 2016

(65) Prior Publication Data

US 2017/0156241 A1    Jun. 1, 2017

(30) Foreign Application Priority Data

Nov. 30, 2015    (CN) .......................... 2015 1 0857945

(51) Int. Cl.
*H05K 9/00*    (2006.01)

(52) U.S. Cl.
CPC .................... *H05K 9/0032* (2013.01)

(58) Field of Classification Search
None
See application file for complete search history.

(56) References Cited

U.S. PATENT DOCUMENTS

| | | | | |
|---|---|---|---|---|
| 3,721,746 A * | 3/1973 | Knappenberger | ... | H05K 9/0032 174/372 |
| 4,109,294 A * | 8/1978 | Mason | ..................... | H05K 5/04 361/709 |
| 5,083,239 A * | 1/1992 | Sedlemeier | .......... | H05K 9/0016 174/351 |
| 5,118,306 A * | 6/1992 | Bixler | .................. | H01R 12/675 439/358 |
| 5,333,100 A * | 7/1994 | Anhalt | ................. | G06K 19/077 174/390 |
| 5,354,951 A * | 10/1994 | Lange, Sr. | ........... | H05K 9/0032 174/372 |
| 5,495,399 A * | 2/1996 | Gore | ..................... | H05K 9/0032 174/354 |
| 5,844,784 A * | 12/1998 | Moran | ................. | H05K 9/0032 174/372 |
| 5,867,366 A * | 2/1999 | Klein | ................... | H01R 4/4809 174/541 |
| 6,049,468 A * | 4/2000 | Learmonth | .......... | H05K 9/0022 174/370 |
| 6,097,608 A * | 8/2000 | Berberich | ............ | G11B 25/043 248/560 |

(Continued)

*Primary Examiner* — Chau N Nguyen
*Assistant Examiner* — Muhammed Azam
(74) *Attorney, Agent, or Firm* — ScienBiziP, P.C.

(57) ABSTRACT

A shielding cover includes a first frame, a second frame, a first cover and a second cover. The second frame is arranged adjacent to the first frame and defines at least one slot. The first cover covers the first frame and includes at least one first latch corresponding to the at least one slot thereon. The second cover covers the second frame and comprises at least one second latch. The at least one slot is exposed from the second cover, the at least one second latch abuts between the first frame and the second frame, the at least one first latch is latched in the at least one slot. A shielding cover assembly and an electronic device employing the shielding cover are also provided.

16 Claims, 5 Drawing Sheets

(56) References Cited

U.S. PATENT DOCUMENTS

| | | | | |
|---|---|---|---|---|
| 6,377,472 B1* | 4/2002 | Fan | H05K 9/0032 | 174/379 |
| 6,383,024 B1* | 5/2002 | Wang | H01R 24/62 | 439/607.23 |
| 6,445,588 B1* | 9/2002 | Masterton | H05K 7/1405 | 174/138 G |
| D464,631 S * | 10/2002 | Billman | D13/184 | |
| 6,483,719 B1* | 11/2002 | Bachman | H05K 9/003 | 174/378 |
| 6,926,551 B1* | 8/2005 | Schulz | H01R 13/6272 | 439/310 |
| 6,991,481 B1* | 1/2006 | Guan | G02B 6/3897 | 439/160 |
| 7,074,052 B1* | 7/2006 | Ni | H01R 13/6658 | 174/261 |
| 7,075,792 B2* | 7/2006 | Tseng | H05K 5/0269 | 361/737 |
| 7,226,316 B2* | 6/2007 | Wu | H01R 13/5825 | 439/357 |
| D549,231 S * | 8/2007 | Doyle | D14/432 | |
| D549,706 S * | 8/2007 | Doyle | D14/432 | |
| 7,342,807 B2* | 3/2008 | Mueller | H05K 7/1424 | 174/521 |
| 7,578,680 B1* | 8/2009 | Wu | H01R 13/6658 | 439/79 |
| 7,588,458 B2* | 9/2009 | He | H01R 13/506 | 439/541.5 |
| 7,727,018 B2* | 6/2010 | Bright | H01R 13/65802 | 439/607.28 |
| 7,733,652 B2* | 6/2010 | Costello | H05K 5/0286 | 165/185 |
| 7,952,889 B2* | 5/2011 | Chao | H05K 1/144 | 174/350 |
| 8,383,960 B2* | 2/2013 | Kurz | H05K 9/0026 | 174/382 |
| 8,974,248 B2* | 3/2015 | Lan | H01R 13/405 | 439/607.01 |
| 2002/0131259 A1* | 9/2002 | Rozy | H05K 9/0015 | 361/818 |
| 2003/0062179 A1* | 4/2003 | West | H05K 9/0032 | 174/382 |
| 2003/0123235 A1* | 7/2003 | Hsu | H01Q 1/084 | 361/752 |
| 2005/0195581 A1* | 9/2005 | Chiou | H05K 5/0269 | 361/752 |
| 2005/0219832 A1* | 10/2005 | Pawlenko | H05K 5/0013 | 361/818 |
| 2005/0254224 A1* | 11/2005 | Fagrenius | H05K 3/341 | 361/800 |
| 2006/0063432 A1* | 3/2006 | Chen | H01R 13/658 | 439/607.36 |
| 2006/0151207 A1* | 7/2006 | Redman | H05K 9/003 | 174/355 |
| 2007/0094977 A1* | 5/2007 | Zuehlsdorf | H04B 1/40 | 52/480 |
| 2007/0121309 A1* | 5/2007 | Long | H05K 9/0032 | 361/818 |
| 2007/0127221 A1* | 6/2007 | Lin | G06F 1/181 | 361/752 |
| 2007/0139904 A1* | 6/2007 | English | H05K 9/0032 | 361/818 |
| 2007/0210082 A1* | 9/2007 | English | H05K 9/0032 | 220/4.21 |
| 2007/0235221 A1* | 10/2007 | Chang | H05K 9/0032 | 174/382 |
| 2008/0080160 A1* | 4/2008 | English | H05K 9/0032 | 361/818 |
| 2008/0305669 A1* | 12/2008 | Hong | G06K 13/0862 | 439/329 |
| 2009/0015994 A1* | 1/2009 | Liu | H05K 5/026 | 361/679.58 |
| 2009/0057003 A1* | 3/2009 | Crotty, Jr. | H05K 9/0032 | 174/372 |
| 2009/0097223 A1* | 4/2009 | Huang | H05K 9/0032 | 361/818 |
| 2009/0167061 A1* | 7/2009 | Lee | E05C 19/06 | 296/203.01 |
| 2009/0168371 A1* | 7/2009 | Tang | G06F 1/186 | 361/740 |
| 2009/0262511 A1* | 10/2009 | Long | H05K 9/0032 | 361/816 |
| 2009/0273912 A1* | 11/2009 | Myers | H05K 9/0032 | 361/818 |
| 2010/0053296 A1* | 3/2010 | Fukumoto | B41J 2/3351 | 347/211 |
| 2010/0097757 A1* | 4/2010 | Wang | H05K 9/0032 | 361/693 |
| 2010/0149780 A1* | 6/2010 | Ren | H05K 9/0032 | 361/818 |
| 2011/0070472 A1* | 3/2011 | Cui | H01M 2/1066 | 429/97 |
| 2011/0073360 A1* | 3/2011 | Su | H05K 9/0032 | 174/377 |
| 2011/0129713 A1* | 6/2011 | Liang | H01M 2/1066 | 429/97 |
| 2011/0266045 A1* | 11/2011 | Xiong | H05K 9/0032 | 174/350 |
| 2013/0027893 A1* | 1/2013 | Vinokur | H05K 9/0032 | 361/748 |
| 2014/0362543 A1* | 12/2014 | Jang | H05K 1/023 | 361/748 |
| 2015/0205334 A1* | 7/2015 | Chuang | G06F 1/1626 | 361/679.3 |
| 2015/0245543 A1* | 8/2015 | Jang | H05K 9/0032 | 361/760 |

* cited by examiner

SHIELDING COVER, SHIELDING COVER ASSEMBLY AND ELECTRONIC DEVICE EMPLOYING THE SAME

FIELD

The subject matter herein generally relates to a shielding cover, a shielding cover assembly and an electronic device employing the shielding cover assembly.

BACKGROUND

Electronic devices normally include radio frequency circuits and shielding covers for preventing electromagnetic Interference. It is general to arrange a blank zone in a circuit board for being latched to the shielding cover. However, the blank zone is a waste of the design size of the circuit board.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout several views.

DETAILED DESCRIPTION

Figure 1:
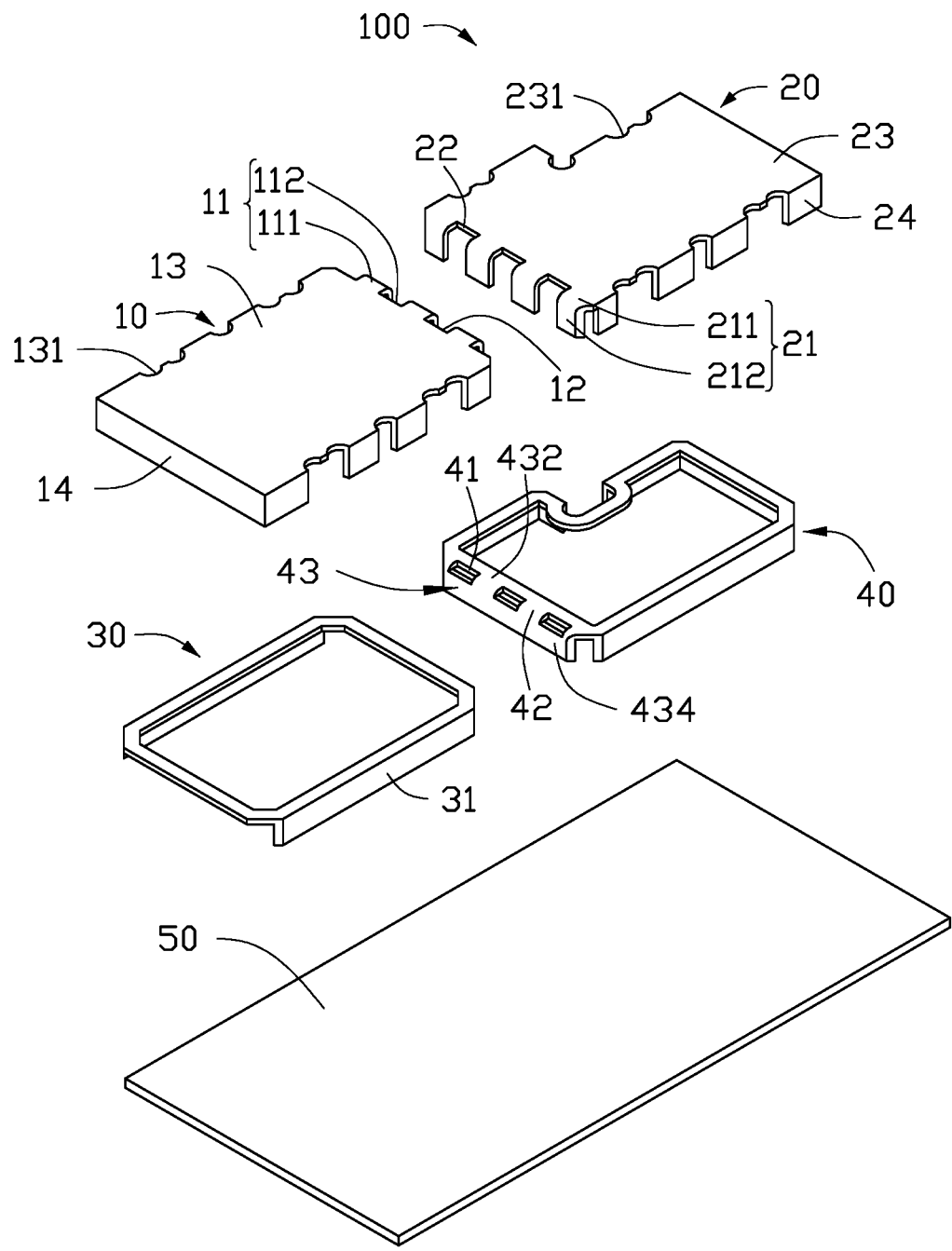
FIG. 1 is an exploded isometric view of an exemplary embodiment of a shielding cover assembly.
Figure 2:
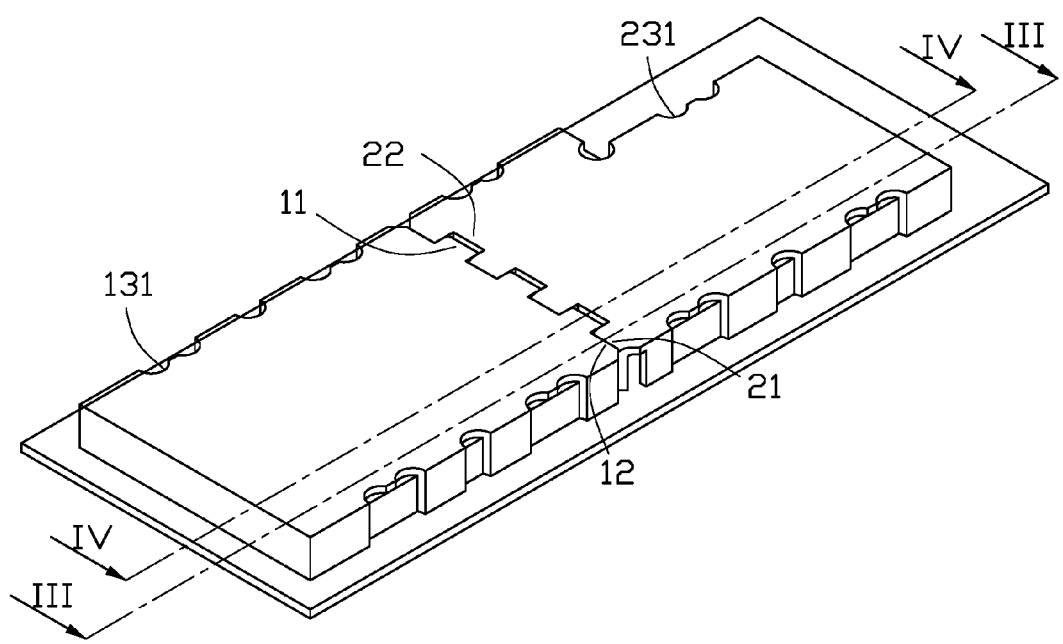
FIG. 2 is an isometric view of the shielding cover assembly of FIG. 1.
Figure 3:
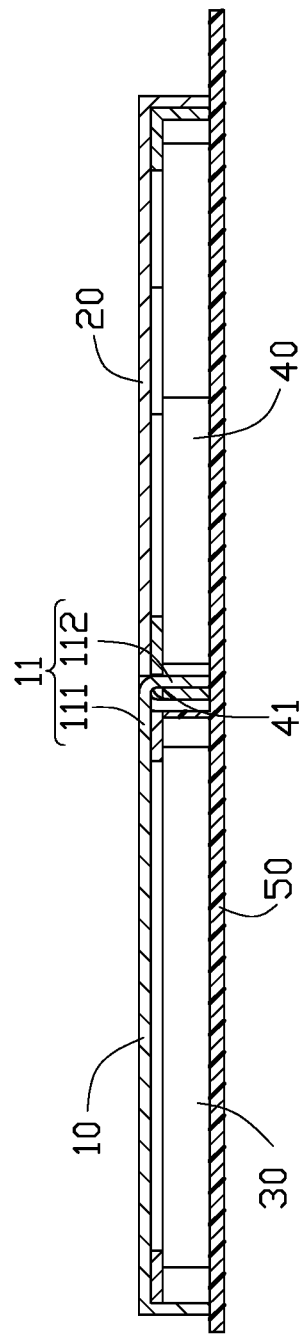
FIG. 3 is a cross-sectional view of the shielding cover assembly of FIG. 2 along line III-III.
Figure 4:
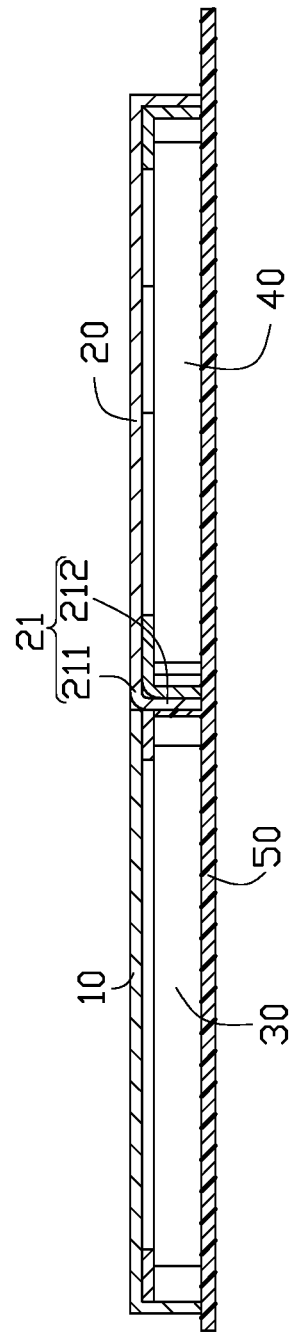
FIG. 4 is a cross-sectional view of the shielding cover assembly of FIG. 2 along line IV-IV.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

Figure 5:
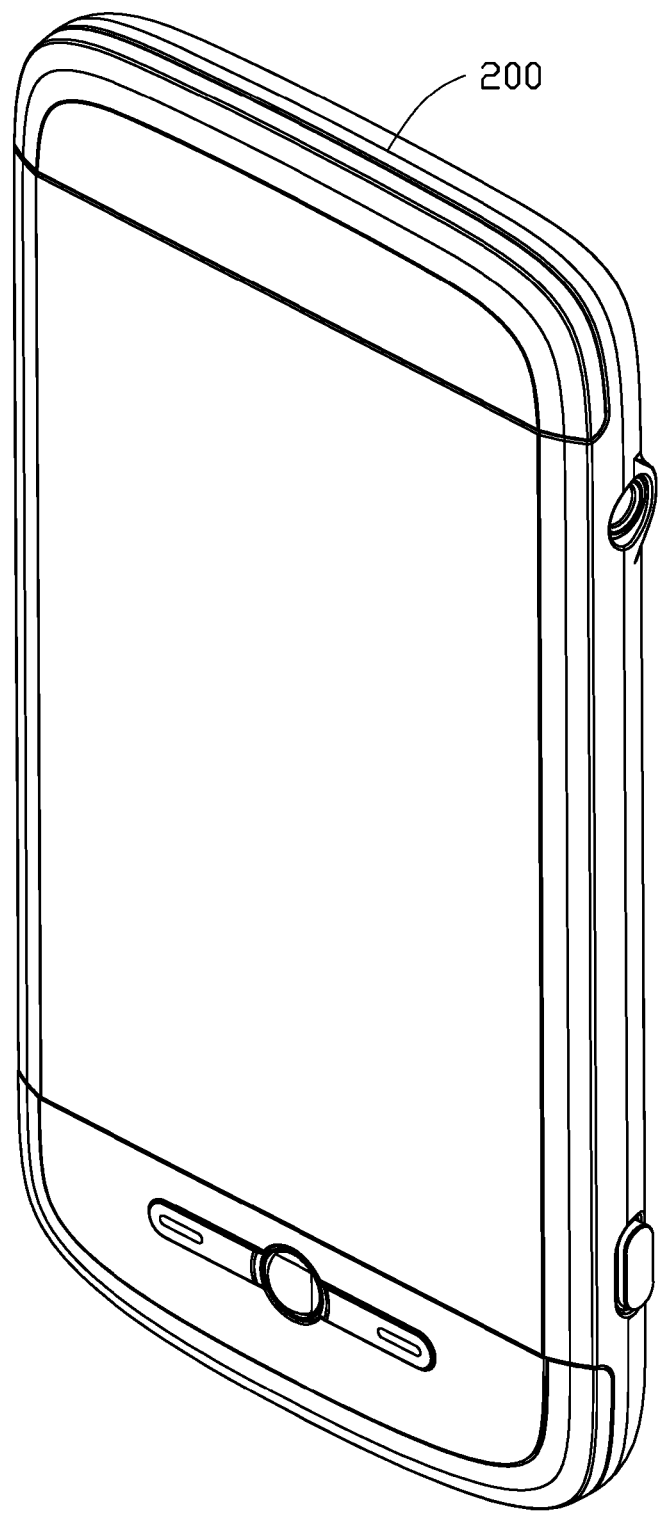
FIG. 5 is an isometric view of an exemplary embodiment of an electronic device.

FIG. 1 illustrates an isometric view an exemplary embodiment of a shielding cover assembly 1 including a shielding cover 100 and a circuit board 50. The shielding cover 100 covers the circuit board 50 to prevent electromagnetic interference to electronic elements arranged on the circuit board 50. FIG. 5 illustrates an isometric view an exemplary embodiment of an electronic device 200 employing the shielding cover assembly 1. The electronic device 200 can be a mobile phone, a personal digital assistant, and a tablet computer. The shielding cover 100 includes a first cover 10, a second cover 20, a first frame 30 and a second frame 40. The first frame 30 and the second frame 40 are both arranged on the circuit board 50, the first cover 10 and the second cover 20 cover the first frame 30 and the second frame 40, respectively.

The first cover 10 is substantially rectangular in shape and includes a first top wall 13 and three first sidewalls 14 substantially and perpendicularly extended from three edges of the first top wall 13. The other edge of the first top wall 13 substantially and perpendicularly extends at least one first latch 11. In at least one embodiment, the first top wall 13 has three first latches 11 extending therefrom, and a recess 12 is formed between every two adjacent latches 11 and between every one latch 11 and one adjacent first sidewall 14 such that four recesses 12 are formed. Each first latch 11 includes a first connecting portion 111 and a first bent portion 112. The first connecting portion 111 is extended from the first top wall 13, the first bent portion 112 is substantially and perpendicularly bent and extended from the first connecting portion 111. A junction of the first top wall 13 and the first sidewalls 14 defines several first grooves 131 for receiving external tools to separate the first cover 13 and the first frame 30.

The second cover 20 is substantially rectangular in shape, and the second cover 20 includes a second top wall 23 and four second sidewalls 24 substantially and perpendicularly extended from peripheral edges of the second top wall 23. One of the second sidewalls 24 corresponding to the first cover 10 includes four second latches 21 and three notches 22, each notch 22 is formed between every two adjacent second latches 21. The second latches 21 correspond to the recesses 12, the notches 22 correspond to the first latches 11. Each second latch 21 includes a second connecting portion 211 and a second bent portion 212. The second connecting portion 211 extends from the second top wall 23, the second bent portion 212 substantially and perpendicularly bends from the second connecting portion 211 and extends perpendicularly with respect to the second connecting portion 211. A junction of the second top wall 23 and the second sidewalls 24 defines several second grooves 231 for receiving external tools to separate the second cover 20 and the second frame 40.

The first frame 30 and the second frame 40 are substantially rectangular frames and aligned to each other. The first frame 30 includes a peripheral wall 31. The second frame 40 includes a front wall 43 corresponding to the first frame 30. The front wall 43 includes a third connecting portion 432 and a third bent portion 434 substantially and perpendicularly extended from the third connecting portion 432. A junction of the third connecting portion 432 and the third bent portion 434 defines several slots 41. In at least one embodiment, the front wall 43 has four supporting portions 42 extending therefrom, and a slot 41 is formed between every two adjacent supporting portions 42 such that three slots 41 are formed.

Referring to FIGS. 1-4, in assemble, the first cover 10 and the second cover 20 cover the first frame 30 and the second frame 40, respectively. The first sidewalls 14 correspond to the peripheral wall 31. The first frame 30 is exposed from the first grooves 131, the second frame 30 is exposed from the second grooves 231. The second latches 21 correspondingly overlap on the supporting portions 42, and the slots 41 are exposed from the notches 22. The first latches 11 are inserted through the notches 22 and latched into the slots 41 one by one. Furthermore, the first connecting portions 111 abut against the second top wall 23 and the first bent portions 112 are inserted into the slots 41. The second latches 21 are correspondingly received in the recess 12, and the second bent portions 212 abut against the first frame 30. Thus, the first cover 10, the first frame 30, the second cover 20 and the second frame 40 are latched to each other. The first frame 30 and the second frame 40 are arranged adjacent to each other and on the circuit board 50.

The first cover 10 and the second cover 20 are latched to each other on the first frame 30 and the second frame 40, thereby decreasing a size of a blank zone from the circuit board 50 while the first cover 10 and the second cover 20 are mounted thereon.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A shielding cover comprising:
a first frame;
a second frame, the second frame arranged adjacent to the first frame and defining at least one slot;
a first cover, the first cover covering the first frame and comprising at least one first latch corresponding to the at least one slot thereon; and
a second cover, the second cover covering the second frame and comprising at least one second latch;
wherein the at least one slot is exposed from the second cover, the at least one second latch abuts between the first frame and the second frame, the first cover comprises a first top wall, the at least one first latch comprises a first connecting portion and a first bent portion, the first connecting portion extends from the first top wall, the first bent portion substantially and perpendicularly bends from the first connecting portion, the first connecting portion abut against the second cover, the first bent portion is latched in the at least one slot.

2. The shielding cover as claimed in claim 1, wherein the first cover is substantially rectangular and comprises three first sidewalls perpendicularly extended from three edges of the first top wall, the at least one first latch substantially and perpendicularly extends from another edge of the first top wall.

3. The shielding cover as claimed in claim 2, wherein the first top wall has a plurality of first latches extending therefrom; a recess is formed between every two adjacent latches and between each latch and one adjacent first sidewall.

4. The shielding cover as claimed in claim 3, wherein each first latch comprises the first connecting portion and the first bent portion.

5. The shielding cover as claimed in claim 2, wherein a junction of the first top wall and each first sidewall defines a plurality of first grooves for exposing the first frame from the first cover.

6. The shielding cover as claimed in claim 4, wherein the second cover is substantially rectangular and comprises a second top wall and four second sidewalls substantially and perpendicularly extended from peripheral edges of the second top wall, one of the second sidewalls corresponds to the first cover and defines at least one notch on one of the sidewalls to correspond to the at least one first latch.

7. The shielding cover as claimed in claim 6, wherein the second sidewall comprises a plurality of second latches and a plurality of notches, each notch is formed between every two adjacent second latches.

8. The shielding cover as claimed in claim 7, wherein each second latch includes a second connecting portion and a second bent portion, the second connecting portion extends from the second top wall, the second bent portion substantially and perpendicularly bends from the second connecting portion.

9. The shielding cover as claimed in claim 8, wherein a junction of the second top wall and the second sidewalls defines a plurality of grooves for exposing the second frame from the second cover.

10. The shielding cover as claimed in claim 8, wherein the first frame is a rectangular frame and comprises a peripheral wall corresponding to the first sidewalls of the first cover.

11. The shielding cover as claimed in claim 10, wherein the second frame comprises a front wall corresponding to the first frame, the front wall comprises a third connecting portion and a third bent portion substantially and perpendicularly extended from the third connecting portion, a junction of the third connecting portion and the third bent portion defines the at least one slot.

12. The shielding cover as claimed in claim 11, wherein a junction of the third connecting portion and the third bent portion comprises a plurality of slots, the front wall has a plurality of supporting portions extending therefrom, a slot is formed between every two adjacent supporting portion such that the plurality of slots are formed.

13. The shielding cover as claimed in claim 12, wherein the second latches correspondingly overlap on the supporting portions, and the slots are exposed from the notches, the first latches are inserted through the notches and latched into the slots one by one.

14. The shielding cover as claimed in claim 8, wherein the first connecting portions abut against the second top wall and the first bent portions are inserted into the slots, the second latches are correspondingly received in the recess, and the second bent portions abut against the first frame.

15. A shielding cover assembly comprising:
a circuit board;
a first frame, the first frame arranged on the circuit board;
a second frame, the second frame arranged on the circuit board and adjacent to the first frame, the second frame defining at least one slot thereon;
a first cover, the first cover covering the first frame and comprising at least one first latch corresponding to the at least one slot; and
a second cover, the second cover covering the second frame and comprising at least one second latch;
wherein the at least one slot is exposed from the second cover, the at least one second latch abuts between the first frame and the second frame, the first cover comprises a first top wall, the at least one first latch comprises a first connecting portion and a first bent portion, the first connecting portion extends from the first top wall, the first bent portion substantially and perpendicularly bends from the first connecting portion, the first connecting portion abut against the second cover, the first bent portion is latched in the at least one slot.

16. An electronic device comprising a shielding cover assembly, the shielding cover assembly comprising:
  a circuit board;
  a first frame, the first frame arranged on the circuit board;
  a second frame, the second frame arranged on the circuit board and adjacent to the first frame, the second frame defining at least one slot thereon;
  a first cover, the first cover covering the first frame and comprising at least one first latch corresponding to the at least one slot; and
  a second cover, the second cover covering the second frame and comprising at least one second latch;
  wherein the at least one slot is exposed from the second cover, the at least one second latch abuts between the first frame and the second frame, the first cover comprises a first top wall, the at least one first latch comprises a first connecting portion and a first bent portion, the first connecting portion extends from the first top wall, the first bent portion substantially and perpendicularly bends from the first connecting portion, the first connecting portion abut against the second cover, the first bent portion is latched in the at least one slot.

* * * * *